United States Patent [19]

Manning

[11] Patent Number: 5,173,754

[45] Date of Patent: Dec. 22, 1992

[54] INTEGRATED CIRCUIT DEVICE WITH GATE IN SIDEWALL

[75] Inventor: Monte Manning, Kuna, Id.

[73] Assignee: Micron Technology, Inc., Boise, Id.

[21] Appl. No.: 829,750

[22] Filed: Feb. 3, 1992

[51] Int. Cl.$^5$ .................. H01L 27/01; H01L 27/02; H01L 29/04

[52] U.S. Cl. .................. 257/69; 257/900; 257/903

[58] Field of Search .................. 357/59 E, 42, 23.7

[56] References Cited

U.S. PATENT DOCUMENTS

| | | | |
|---|---|---|---|
| 4,554,572 | 11/1985 | Chatterjee | 357/59 E |
| 4,724,530 | 2/1988 | Dingwall | 357/23.7 |
| 4,980,732 | 12/1990 | Okazawa | 357/42 |
| 5,001,540 | 3/1991 | Ishihara | 357/23.7 |

OTHER PUBLICATIONS

A 0.1 μA Standby Current, Bounding-Noise-Immune 1 Mb SRAM, by Manabu Ando, et al. NEC Corporation, Japan.

*Primary Examiner*—Rolf Hille
*Assistant Examiner*—Robert Limanek
*Attorney, Agent, or Firm*—Dorr, Carson, Sloan & Peterson

[57] ABSTRACT

An SRAM wafer is conventionally fabricated through the definition of the gate poly. The PMOS oxide is then applied in a layer that uniformly covers the surface and sidewalls of the gate poly, then the interpoly contacts are patterned and etched and the NMOS S/D's are implanted. The PMOS load poly is deposited, again in a layer that uniformly covers the PMOS oxide over the surface and sidewalls of the gate poly. Oxide spacers are formed on the PMOS poly along the gate poly sidewalls, and a P+ implantation forms the PMOS sources and drains. The oxide spacers protect an L-shaped region along the poly gate sidewall from the P+ implant, thus defining PMOS load channels on either side of the gate poly that are gated by the gate poly sidewalls. The foot of the L on one side and the extension of the L above the gate poly on the other create gate/drain offsets that reduce I(off). Optionally, a gate poly/oxide stack may be used to enlarge one of the gate/drain offsets.

18 Claims, 4 Drawing Sheets

INTEGRATED CIRCUIT DEVICE WITH GATE IN SIDEWALL

BACKGROUND OF THE INVENTION

1. Field of the Invention

The invention in general relates to the structure and fabrication of integrated circuits and more particularly to a structure and fabrication process for a circuit in which a channel of a transistor is located on the sidewall of its gate.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dies or chips. The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, smaller size can also lead to problems, such as greater chances of current leakage across boundaries where current in not supposed to flow. Thus circuit structures and fabrication processes that reduce the physical space occupied by a circuit and at the same time do not increase or even reduce such current leakage problems are extremely useful in integrated circuit technology.

While integrated circuits are commonly referred to as "semiconductor devices" they are in fact fabricated from various materials which are either electrically conductive, electrically non-conductive, or electrically semiconductive. Silicon, the most commonly used semiconductor material, can be used in either the single crystal or polycrystalline form. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant as N-type silicon.

CMOS (Complimentary Metal Oxide Semiconductor) technology is currently the most commonly used integrated circuit technology, and thus the present invention will be described in terms of silicon-based CMOS technology, although it is evident that it may find uses in other integrated circuit technologies. The term CMOS is now-loosely applied to mean any integrated circuit in which both N-channel and P-channel MOSFETs (Metal-Oxide-Semiconductor Field Effect Transistors) are used in a complimentary fashion. It should be noted here that because the dominant carrier in a MOSFET occurs in an inversion layer, the channel of an N-channel MOSFET is actually doped P-type and the channel of a P-channel MOSFET is actually doped N-type. CMOS integrated circuit fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the starting point. If other materials are used as the starting point, there may be differences in materials and structure as is well-known in the art, e.g. with N-type silicon as the starting point dopant types may be reversed, or P-type wells may be introduced.

SRAM (Static Random Access Memory) are one of the most densely-packed integrated circuits commonly manufactured today. Thus a structure and process that permits smaller physical circuit structures without increasing leakage problems, or even diminishing leakage problems, and which is applicable to SRAM would be particularly valuable.

The business of fabricating CMOS semiconductor devices is a very competitive, high-volume business. Thus manufacturing efficiency is highly important. Product quality and reliability are also highly important. It is well-known in the art that reducing the number of mask steps in the integrated manufacturing process not only reduces manufacturing costs and time but also generally increases the quality and reliability of the end product, since the opportunities for disabling defects to occur are reduced. This in turn feeds back into further reduced manufacturing costs since scrapped product is reduced. Thus, a circuit structure and process that not only permits more compact devices but also reduces the number of mask steps would therefore be highly desirable.

A typical state-of-the-art SRAM and its fabrication process are described in "A 0.1 $\mu$A Standby Current, Bouncing-Noise-immune 1 Mb SRAM" by Manabu Ando et al. in the IEEE Journal of Solid State Circuits, V. 24, No. 6, December, 1989, pp. 1708–1713. As can be seen in FIG. 9, the PMOS load transistor (indicated by the P+ doping) is not self-aligned and thus requires significant masking and space. This reference also discloses that providing a gate/drain or channel/drain offset reduces off current, I(off), in PMOS thin-film transistors (TFT's). However, the offset discloses compounds the alignment problem and adds additional physical size to the PMOS load transistor. The above reference pertains to 1 Mb SRAM. However users of SRAM are now demanding 4 Mb and 16 Mb SRAM. Thus a need exists for an integrated circuit which is more compact and still has performance equal to or better than the prior art SRAM.

3. Solution to the Problem

The present invention provides for using the sidewall of a gate layer to gate a channel of a transistor; in the preferred embodiment, the sidewall of one transistor, previously formed in the fabrication process, as the gate of a second transistor.

The invention also provides for novel self-aligning of transistor parts; in particular the invention provides a novel transistor structure that provides for a self-aligned PMOS load transistor in an SRAM circuit.

In providing the above structure and process, the invention provides an integrated circuit that is more compact than prior art integrated circuits.

The invention further provides an integrated circuit structure and process that requires fewer mask steps; in particular it provides a structure and process that does not require a mask for the SRAM PMOS load transistor channel definition.

The invention in addition provides a gate/drain offset that takes up little additional physical space.

The present invention is particularly applicable to SRAM in that in one embodiment it applies to circuits in which gates of two or more transistors are shorted together, which is a common SRAM circuit design. Once its use in SRAM is understood, however, it is evident that it can be applied in other circuits also.

SUMMARY OF THE INVENTION

The invention provides an integrated circuit comprising: a semiconducting substrate defining a plane; transistor gate means for providing a gating function, the gate means having a first surface essentially parallel to the plane of the substrate and a sidewall essentially perpendicular to the first surface; an insulating layer extending over at least a portion of the first surface and the sidewall; and a transistor semiconducting layer extending over at least a portion of the insulating layer, the transistor semiconducting layer having transistor source, drain and channel regions, the transistor channel region being essentially parallel to the sidewall and gated by the sidewall of the transistor gate means. Preferably the transistor gate means has first and second sidewalls, the semiconducting layer has first and second channel regions, and the first channel region is gated by the first sidewall while the second channel region is gated by the second sidewall. Preferably, the integrated circuit further includes offset means for proving an offset between the gate means and the drain region. Preferably, the offset means comprises a portion of the semiconducting layer that has the same doping as and is continuous with the channel region but is not gated by the gate means, or alternatively the offset means comprises another insulating layer formed on the first surface of the transistor gate means.

In another aspect the invention provides a high-density SRAM integrated circuit having a first transistor and a second transistor, the integrated circuit comprising: a semiconductor substrate having first transistor source, drain, and channel regions formed in it; a first insulating layer extending over at least the first transistor channel region; a first transistor gate means for gating the first transistor channel region, the gate means having a first surface and a sidewall essentially perpendicular to the first surface; a second insulating layer extending over at least a portion of the first surface and the sidewall; and a second transistor semiconducting layer extending over at least a portion of the second insulating layer, the second transistor semiconducting layer having second transistor source, drain and channel regions, the second transistor channel region being essentially parallel to the sidewall and gated by the sidewall of the first transistor gate means. Preferably, there are two of the sidewalls and two of the second transistor channel regions, each channel region gated by a different sidewall. Preferably, the second transistor source, drain, and channel regions are self-aligned with the gate means. Preferably, the integrated circuit further includes offset means for offsetting the second transistor drain region from the gate means. Preferably, the offset means comprises a portion of the second semiconducting layer that has the same doping as and is continuous with the second transistor channel region but is not gated by the gate means, or the offset means may also comprise a third insulating layer between the first transistor gate means first surface and the second insulating layer.

The invention also provides an integrated circuit manufacturing process comprising the steps of: providing a semiconductor substrate defining a plane; forming transistor gate means for performing a gating function, the transistor gate means having a first surface essentially parallel to the substrate plane and a sidewall essentially perpendicular to the first surface; forming an insulating layer overlying at least a portion of the transistor gate means first surface and sidewall; forming a transistor semiconductor layer overlying the insulating layer; and creating transistor source, drain, and channel regions in the transistor semiconducting layer, with the transistor channel region in a portion of the transistor semiconductor layer parallel to the sidewall. Preferably, the step of creating transistor source, drain, and channel regions comprises forming a protective layer over the transistor semiconducting layer in the region adjacent the sidewall, and doping the transistor semiconducting layer to form the transistor source and drain regions. Preferably, the step of creating transistor source, drain and channel regions further includes creating an offset between the gate means and the drain.

In yet a further aspect, the invention provides an integrated circuit manufacturing process comprising the steps of: providing a semiconductor substrate having a planar surface; creating first transistor source, drain, channel regions in the substrate; forming a first insulating layer on the substrate; forming a first transistor gate means on the first insulating layer for gating the first transistor channel region, the first transistor gate means having a first surface essentially parallel to the substrate planar surface and a sidewall essentially perpendicular to the first surface; forming a second insulating layer overlying at least a portion of the first transistor gate means first surface and sidewall; forming a second transistor semiconductor layer overlying the second insulating layer; and creating second transistor source, drain, and channel regions in the second transistor semiconducting layer, with the second transistor channel region being in the portion of the second transistor semiconductor layer parallel to the sidewall. Preferably, the step of creating first transistor source, drain, an channel regions in the substrate comprises: providing a lightly P-doped semiconductor in the step of providing; patterning contact regions in the first insulating layer; and implanting N-type ions in the first transistor source and drain regions in the substrate either before or after the step of forming a second transistor semiconductor layer. Preferably, the step of creating second transistor source, drain, and channel regions comprises forming a protective spacer over the second transistor semiconducting layer in the region adjacent the sidewall, and doping the second transistor semiconducting layer to form the second transistor source and drain regions. Preferably, the step of forming a second transistor semiconductor layer comprises forming a lightly N-doped semiconductor layer, and the step of doping comprises doping the source and drain regions with a P-type ion. Preferably, the process further comprises the step of forming a third insulating layer on the first transistor gate first surface prior to the step of forming a second insulating layer. Preferably, the semiconductor substrate comprises lightly P-doped silicon, the step of forming the first transistor source, drain and channel regions comprises forming an N-channel transistor, and the step of creating second transistor source, drain, and channel regions comprises forming a P-channel transistor.

The invention not only provides a more compact integrated circuit with improved circuit performance, but it also provides an integrated circuit that is more orderly and thus easier to understand, which saves design time. Numerous other features, objects and advantages of the invention will become apparent from the following description when read in conjunction with the accompanying drawings.

DESCRIPTION OF THE PREFERRED EMBODIMENT

1. Overview

Figure 1:
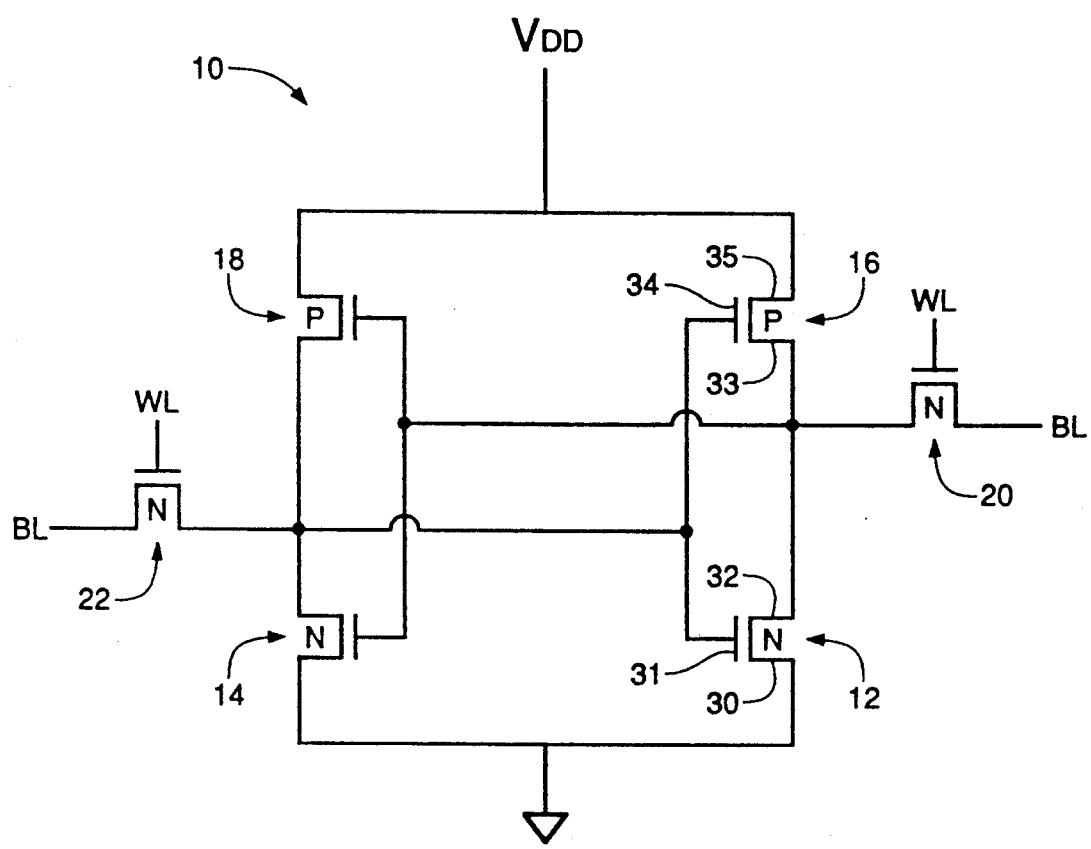
FIG. 1 shows a circuit diagram of a typical SRAM cell of the type in which the invention is implemented.

Turning now to FIG. 1, a circuit diagram of a single cell 10 of a typical SRAM is shown. An SRAM chip may contain millions of such cells. The cell 10 of FIG. 1 contains four N-channel MOSFET transistors, 12, 14, 20, and 22, and two P-channel MOSFET transistors 16 and 18. The P-channel transistors 16 and 18 function as loads for the N-channel transistors, that is they could be replaced by resistors but are implemented as transistors because such transistors use much less current than resistors. As will be seen below, in the preferred embodiment of the invention each P-channel load transistor, such as 16, is actually implemented as two P-channel transistors 16A and 16B (FIG. 2E) in series, however this is not shown in FIG. 1 since the circuit shown in FIG. 1 is the more common representation of an SRAM.

In the SRAM of FIG. 1, gate 31 of transistor 12 is connected to gate 34 of transistor 16, the drains 32 and 33 of transistors 12 and 16, respectively, are connected, the source 30 of transistor 12 is grounded (as indicated by the inverted triangle), and the source 35 of transistor 16 is connected to the $V_{DD}$ voltage. The gates 31 and 34 of transistors 12 and 16, respectively, are connected to the bit line (BL) through transistor 22 which is gated by the word line (WL). The drains 32 and 33 of transistors 12 and 16 respectively are connected to the bit line through transistor 20 which is gated by the word line. The connections of transistors 14 and 18 are a mirror image of the connections of transistors 12 and 16. The SRAM circuit just described is conventional and thus will not be discussed further herein. It is presented to assist in understanding of the invention which relates to the particular structure and process of forming a wafer for a semiconductor device, which structure and process are shown in detail in FIGS. 2A through 4. Referring to FIG. 2E, according to the invention, the channels 68 and 70 of transistors 16A and 16B respectively are formed along the sidewalls 48 and 49 respectively of the gate 44 of transistor 12 and are gated by the respective sidewalls. As will be seen, this is a more compact and simpler way to manufacture such transistors and has many other advantages.

2. Detailed Description of the Fabrication

Figure 2A:
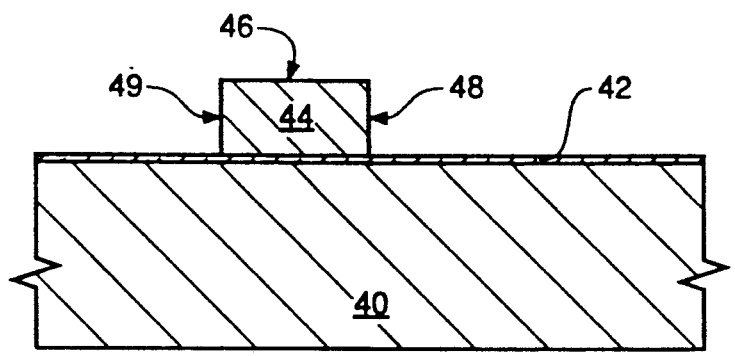
FIG. 2A is a cross-sectional view of a portion of an SRAM wafer of the present invention having a circuit as shown in FIG. 1 in an early stage of fabrication in which the first gate oxide has been formed on the silicon substrate and the first transistor gate poly has been defined.

Turning now to a more detailed description of the invention, FIG. 2A shows a cross-section of the wafer of the SRAM of FIG. 1 in a preliminary stage of fabrication. A lightly-doped P-type single crystal silicon substrate 40 has been provided, and a thin insulating layer 42, preferably silicon dioxide, has been formed by thermal oxidation, or other conventional process. A layer of N+ doped polysilicon has been deposited, doped, and defined by a conventional masking and etching process to form the gate of transistor 12, which we shall refer to below as the "first" transistor. The first transistor gate 44 has a first surface 46 which preferably is generally planar. Gate 44 also has two sidewalls 48 and 49 which are preferably essentially perpendicular to the surface 46. By "essentially perpendicular" is meant perpendicular within the ability of the technology to create perpendicular surfaces. Because surface 46 and sidewalls 48, 49 are created by deposition, masking, and etching processes which are governed by statistical laws, in practice the angles between them may deviate considerably from the perpendicular.

Figure 2B:
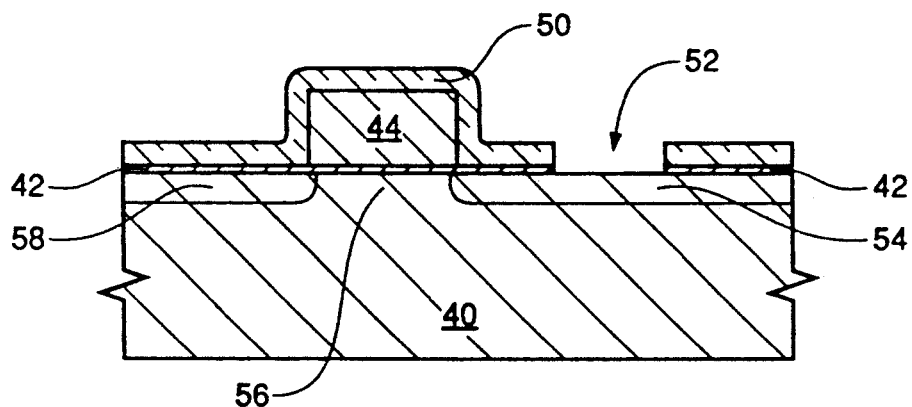
FIG. 2B is a cross-sectional view of the SRAM wafer of FIG. 2A in which the PMOS load gate oxide has been deposited, the interpoly contacts have been patterned, and the source/drains of the first transistor have been implanted in the silicon substrate.

Referring to FIG. 2B, a second insulating layer 50 of silicon dioxide is deposited on the wafer. This oxide will become part of the P-channel load transistor 16 and may be referred to as the PMOS load gate oxide 50 or second transistor gate oxide 50. The interpoly contact areas 52 are then patterned and etched by conventional processes. Then the final sources and drains (S/D's) 58, 54 may be implanted. Alternatively, the source/drain regions 58, 54 may be formed prior to the deposition of the gate oxide 50. If lightly doped drains (LDD's) are required, preferably a disposable spacer process would be used such that no spacer remains after S/D formation. In the embodiment shown the drains 54 and sources 58 of the first transistor 12 have been formed by ion implantation or other conventional process. In the preferred embodiment N+ doping is selected, although other doping depending on the particular SRAM desired may be used. The implantation of drains 54 and sources 58 also defines the first channels 56 of first transistor 12 as the areas 56 of P-type doping between the sources 58 and drains 54.

Figure 2C:
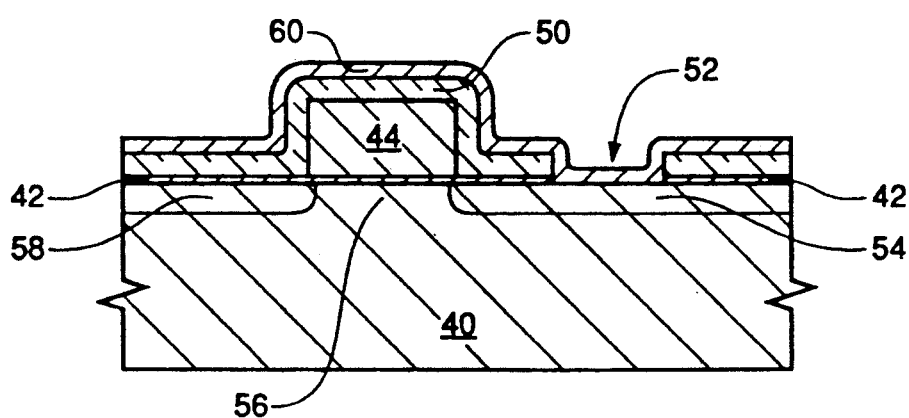
FIG. 2C is a cross-sectional view of the SRAM wafer of FIG. 2B in which the PMOS load transistor poly has been deposited.

Turning now to FIG. 2C a layer 60 of lightly N-doped polysilicon has been deposited. This is the poly in which the channel of the P-channel load transistor 16 (implemented as transistors 16A and 16B in FIG. 2E) will be formed, and thus it may be called the PMOS load poly or second transistor poly layer 60.

Figure 2D:
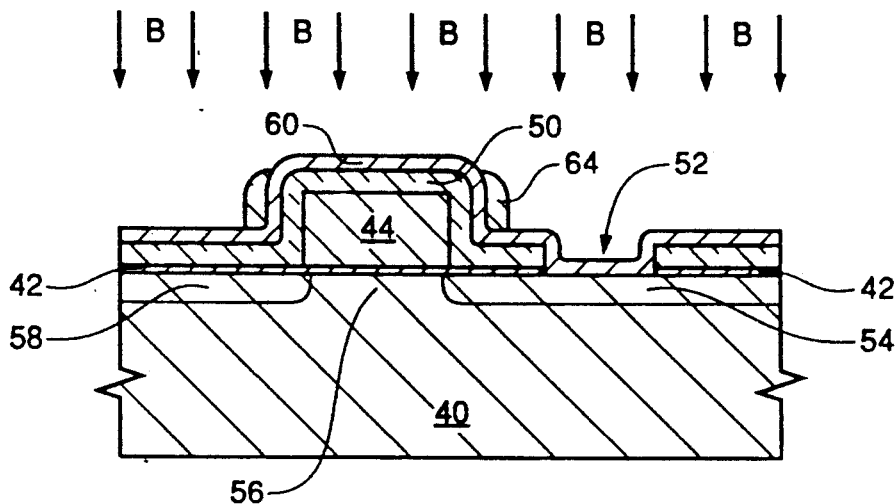
FIG. 2D is a cross-section of the SRAM wafer of FIG. 2C on which an oxide spacer has been formed to protect the PMOS load channel region, and showing the implantation of boron ions.
Figure 2E:
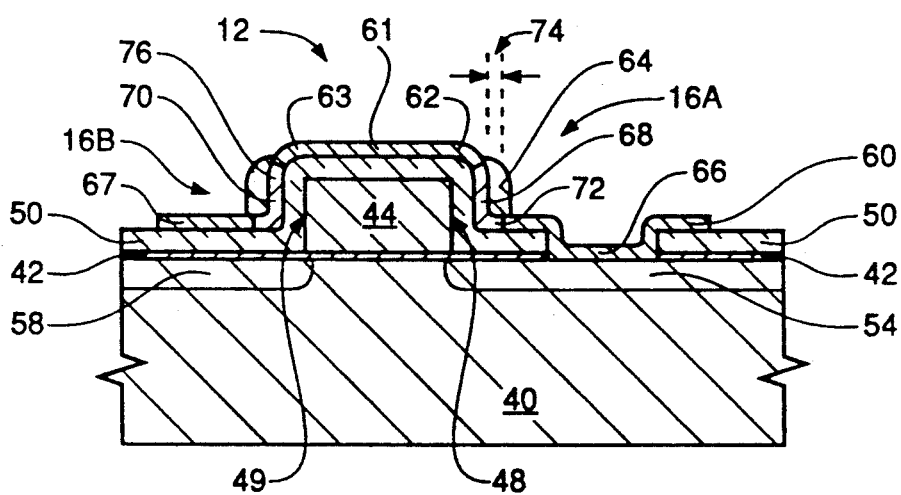
FIG. 2E is a cross-sectional view of the SRAM wafer of FIG. 2D in which the PMOS load transistor source and drains have been formed by the implantation process of FIG. 2D and have been patterned.

FIG. 2D illustrates the next steps of the fabrication process. Protective spacers 64, preferably of silicon dioxide, are formed on the PMOS load poly layer 60 on the sides of the gates 44 by depositing the silicon dioxide and then performing a blanket anisotropic etch. When the silicon dioxide is deposited, it will be thicker wherever it passes over a step down, and thus the blanket etch will leave the spacers 64 as shown if the blanket etch is stopped short of total etch. These spacers 64 may be optional depending on the setup for the next step of implanting the PMOS load transistor's sources and drains and the repeatability of the poly profiles.

In the preferred embodiment shown, the spacers 64 are formed and a boron (B) implant is performed to create a P+ doping to form the PMOS sources 62, 67, and drains 63, 66 as shown in FIG. 2E. Then the PMOS poly is patterned by masking and etching in a conventional manner as also shown in FIG. 2E. It should be noted here that, as mentioned above, load transistor 16 is actually implemented as two PMOS transistors 16A and 16B in series: that is, the source 62 of one PMOS transistor 16A is connected to the drain 63 of the other PMOS transistor 16B. In this implementation the length of boron-doped poly 61 directly above the gate 44 forms both the source 62 of transistor 16A and the drain 63 of transistor 16B in a continuous P+ doped poly region.

During the boron implant process, the spacers 64 prevent the P+ implant from reaching the channel regions 68, 70 of the PMOS load poly 60. Thus the P+ implant also defines the PMOS load channels 68 and 70 of transistors 16A and 16B respectively. Channels 68 and 70 are preferably formed essentially perpendicularly along the sidewalls 48 and 49 of gate 44 and are gated by these sidewalls 48 and 49. As the above description indicates, no mask step is necessary to form the PMOS sources and drains and to define the PMOS channels.

Figure 3:
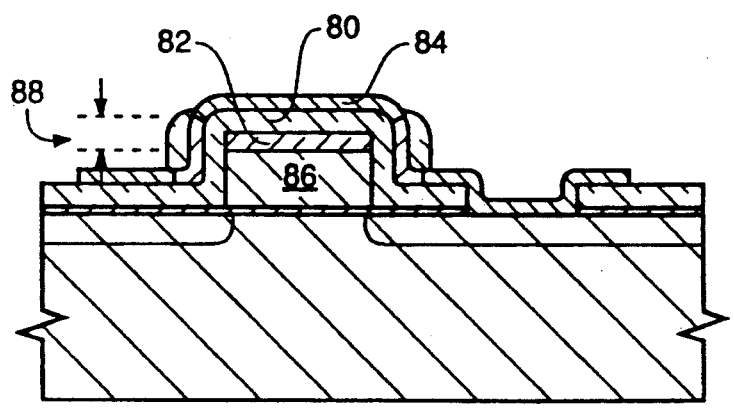
FIG. 3 shows an alternative embodiment of the SRAM wafer of FIG. 2E in which an additional oxide layer has been formed on the first transistor gate poly to create a gate/drain offset.

The design of the spacers 64 is such to create offsets, such as 74, between each of the drains 63 and 66 and gate 44. Focusing for the moment on the details of transistor 16A, the channel 68 will be that portion of the lightly N-doped region that lies parallel to sidewall 48 of gate 44. However, a small foot 72 of lightly N-doped poly continues to the right (in FIGS. 2E and 3) away from the gate 44. The conducting inversion layer that creates the channel 68 will not form in this foot 72 because the inversion layer is caused by the voltage in the gate 44. Thus this area will be essentially non-conducting and will provide an offset of a distance indicated by lines 74 between channel 68 and drain 66. Such gate/drain offsets lower the I(off) and thus improve transistor performance. Continuation 76 of the lightly N-doped poly does not create an offset between drain 63 and gate 44. Since the extension 76 extends parallel to gate 44 (in contrast to foot 72 which extends directly away from gate 44), carriers in it will be effected by the voltage in gate 44 to a greater extent than the carriers in foot 72. Thus it may be desirable to create an offset in this area. This may be done by creating a poly/oxide stack as shown in FIG. 3. That is, prior to the step of creating oxide layer 80 (corresponding to layer 50 in the embodiment of FIGS. 2A-2E), a silicon dioxide layer 82 is created which "stacks" on top of N+ doped poly gate 86. This additional oxide layer 82 creates an offset distance 88 between drain 84 and gate 86.

When the invention is implemented in SRAM as described above, a diode is formed at the junction of the P-channel transistor's 16A load drain 66 and the N-channel first transistor's 12 drain 54. Preferably, the boron implant and the N+ S/D implants are designed so that this junction resides within the poly layer 60, which provides better circuit performance.

Figure 4:
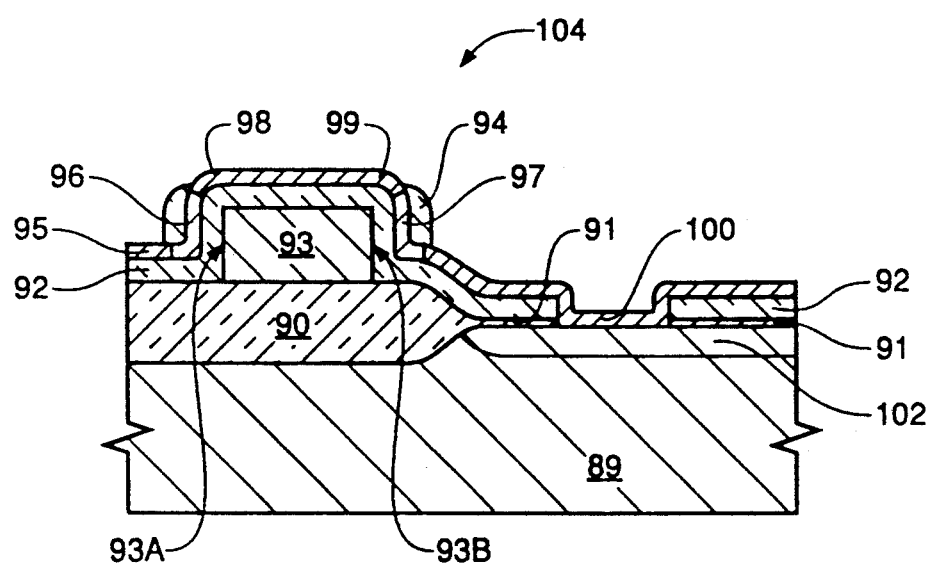
FIG. 4 shows an alternative embodiment of the invention in which the channel is formed in the sidewall of a gate formed over field oxide.

FIG. 4 shows an alternative embodiment of the invention in which the channels 96 and 97 of a PMOS device 104 are formed on the sidewalls 93A and 93B of a gate 93 formed over field oxide 90. The substrate 89 is again lightly P-doped single crystal silicon. In this embodiment, at the left side, a relatively thick silicon dioxide layer, generally known in the art as "field ox" provides spacing required by the design. On the right is an N+ S/D. In other respects this embodiment is similar to the embodiment of FIG. 2E, including insulating oxide layer 91, gate poly 93 having sidewalls 93A and 93B, PMOS oxide layer 92, lightly N-doped P-channel semiconducting layer 95, and oxide spacers 94. The semiconducting layer 95 has been Boron implanted to form drains, such as 98, 100 and sources, such as 99, to define p-channels 96 and 97 protected by spacers 94. Many other implementations of the invention may be devised.

The particular dimensions of the various layers and parts described above can vary widely depending on a wide variety of factors. The nominal size in the preferred embodiment as well as an approximate range for each of the important dimensions are as follows: the gate poly 44, 86 height is nominally about 5000 Å and can range from about 1500Å to about 7000Å; the optional oxide layer 82 is nominally about 2000Å thick and can range from about 50Å to about 5000Å; oxide spacers 64 have a height slightly less than the combined height of the gate poly 44 or, in the alternate embodiment, the gate poly 86 and oxide 82 stack, preferably between about 50Å and about 500Å less and nominally about 250Å less, while the nominal width of the spacers 64 is about 2000Å and can range from about 500Å to about 4000Å; PMOS poly layer 60, 84 is nominally about 400Å thick and can range from about 50Å to about 2000Å; PMOS oxide layer 50, 80 is nominally about 300Å thick and can range from about 50Å to about 2000Å. The other relevant dimensions all depend on the above dimensions, as for example the offset distances 74 and 88, or are conventional.

After the above-described structure is formed, the SRAM wafer is completed and dies are cut and packaged in any conventional manner.

A feature of the invention is that the PMOS channels 68 and 70 are formed along the sidewall of the gate poly 44 and are gated by the gate poly sidewalls 48 and 49 respectively. This arrangement provides a tighter structure for the PMOS transistors. In addition the structure of the PMOS load transistor becomes much more ordered and related to the structure of the NMOS transistor, which makes the structure easier to grasp and reduces design time. Similarly the forming of the channels 96 and 97 along the sidewalls 93A and 93B of gate 93 in the embodiment of FIG. 4 provides a tighter, more ordered structure to the devices of that embodiment also.

A related feature of the invention is that the sources, drains, and channels of the PMOS load transistor are self-aligned to the gate poly 44, with the result that no separate masking steps are required to perform the alignment and thus reducing the number of masking operations that are required in the fabrication process. Similarly, the PMOS device 104 of FIG. 4 is also self-aligned with the gate 93, reducing the number of masking steps.

Another feature of the invention is that gate/drain offsets are also automatically provided by the process and structure, which provides improved transistor performance without additional steps.

There has been described a novel fabrication process and structure which can be utilized to build more compact and better performing SRAMS and which has many other advantages. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to construct channels for one transistor on the sidewalls of the gates of another transistor, and that such structure leads to self-alignment and other advantages, other implementations of such structure become evident. It is also evident that the steps recited may often be performed in a different order, for example, the first transistor source, drain, and channel regions 54, 56, and 58 respectively may be formed before or subsequent to many of the other steps. Or the various structures described may be made with a variety of processes, dimensions, and materials. A greater or lesser number of process steps may be used. Consequently, the invention is to be construed as embracing each and every novel feature and novel combination of features present in and/or possessed by the integrated circuit structure and fabrication process described.

What is claimed is:

1. An integrated circuit comprising:
a semiconducting substrate defining a plane;
transistor gate means for providing a gating function, said gate means having a first surface essentially parallel to the plane of said substrate and a sidewall essentially perpendicular to said first surface;
an insulating layer extending over at least a portion of said first surface and said sidewall;
a transistor semiconducting layer extending over at least a portion of said insulating layer, said transistor semiconducting layer having transistor source, drain and channel regions, said transistor channel region being essentially parallel to said sidewall and gated by said sidewall of said transistor gate means; and
offset means for providing an offset between said gate means and one of said drain region and said source region, said offset means comprising another insulating layer formed on said first surface of said transistor gate means.

2. An integrated circuit as in claim 1 wherein said transistor gate means has first and second sidewalls, said semiconducting layer has first and second channel regions, and said first channel region is gated by said first sidewall while said second channel region is gated by said second sidewall.

3. An integrated circuit as in claim 1 wherein said offset means further comprises a portion of said semiconducting layer that has the same doping as and is continuous with said channel region but is not gated by said gate means.

4. An integrated circuit comprising a first transistor and a second transistor, said circuit comprising:
a semiconducting substrate containing first transistor source, drain, and channel regions;
a first insulating layer extending over at least a portion of said first transistor channel region;
first transistor gate means for gating said first transistor channel region, said gate means having a first surface and a sidewall essentially perpendicular to said first surface;
a second insulating layer extending over at least a portion of said first surface and said sidewall;
a second transistor semiconducting layer extending over at least a portion of said second insulating layer, said second transistor semiconducting layer having second transistor course, drain and channel regions, said second transistor channel region being essentially parallel to said sidewall and gated by said sidewall of said first transistor gate means; and
offset means for offsetting one of said second transistor drain region and said second transistor source region from said gate means, said offset means comprising a third insulating layer formed on said first transistor gate means.

5. An integrated circuit as in claim 4 wherein said first transistor is an N-channel transistor and said second transistor is a P-channel transistor.

6. An integrated circuit as in claim 4 wherein said offset means further comprises a portion of said second transistor semiconducting layer that has the same doping as and is continuous with said channel region but is not gated by said gate means.

7. An integrated circuit as in claim 4 wherein said first transistor gate means comprises doped polysilicon and said third insulating layer comprises silicon dioxide.

8. A high-density SRAM integrated circuit having a first transistor and a second transistor, said integrated circuit comprising:
a semiconductor substrate having first transistor source, drain, and channel regions formed in it;
a first insulating layer extending over at least said first transistor channel region;
a first transistor gate means for gating said first transistor channel region, said gate means having a first surface and a sidewall essentially perpendicular to said first surface;
a second insulating layer ext ending over at least a portion of said first surface and said sidewall;
a second transistor semiconducting layer extending over at least a portion of said second insulating layer, said second transistor semiconducting layer having second transistor source, drain and channel regions, said second transistor channel region being essentially parallel to said sidewall and gated by said sidewall of said first transistor gate means; and
offset means for offsetting one of said second transistor drain region and said second transistor source region from said gate means, said offset means comprising a third insulating layer formed on the said first transistor gate means.

9. A high density SRAM integrated circuit as in claim 8 wherein there are two of said sidewalls and two of said second transistor channel regions, each channel region gated by a different sidewall.

10. A high density SRAM integrated circuit as in claim 9 wherein said second transistor source, drain, and channel regions are self-aligned with said gate means.

11. A high-density SRAM integrated circuit as in claim 8 wherein said offset means further comprises a portion of said second semiconducting layer that has the same doping as and is continuous with said channel region but is not gated by said gate means.

12. A high density SRAM as in claim 8 wherein said second transistor drain region contacts said first transistor drain region forming an N-P junction diode, and wherein the junction resides with the second transistor polysilicon.

13. An integrated circuit as in claim 1 wherein said offset means provides and offset between said gate and said drain region.

14. An integrated circuit as in claim 1 wherein said offset means provides and offset between said gate means and said source region.

15. An integrated circuit as in claim 4 wherein said offset means provides an offset between said gate means and said second transistor drain region.

16. An integrated circuit as in claim 4 wherein said offset means provides and offset between said gate means and said second transistor source region.

17. A high-density SRAM integrated circuit as in claim 8 wherein said offset means provides and offset between said gate means and said second transistor drain region.

18. A high-density SRAM integrated circuit as in claim 8 wherein said offset means provides and offset between said gate means and said second transistor source region.

* * * * *